(12) United States Patent
Kim et al.

(10) Patent No.: US 7,128,454 B2
(45) Date of Patent: Oct. 31, 2006

(54) LIGHT EMITTING DIODE MODULE FOR AUTOMOBILE HEADLIGHTS AND AUTOMOBILE HEADLIGHT HAVING THE SAME

(75) Inventors: Hyung Suk Kim, Suwon (KR); Young June Jeong, Suwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 51 days.

(21) Appl. No.: 10/924,866

(22) Filed: Aug. 25, 2004

(65) Prior Publication Data
US 2006/0002125 A1    Jan. 5, 2006

(30) Foreign Application Priority Data
Jul. 1, 2004    (KR) ............... 10-2004-0051001

(51) Int. Cl.
*F21V 29/00*    (2006.01)
(52) U.S. Cl. ............. 362/507; 362/800; 362/373; 362/545; 362/547; 361/704
(58) Field of Classification Search ........... 362/507, 362/538, 545, 800, 547, 373; 439/617, 611
See application file for complete search history.

(56) References Cited

U.S. PATENT DOCUMENTS

| | | | | |
|---|---|---|---|---|
| 3,508,100 A | * | 4/1970 | Tillays et al. | 313/499 |
| 3,818,215 A | * | 6/1974 | Schmidt et al. | 362/549 |
| 5,720,548 A | * | 2/1998 | Geary | 362/260 |
| 5,991,160 A | * | 11/1999 | Lumbard | 361/760 |
| 6,476,549 B1 | * | 11/2002 | Yu | 313/499 |
| 6,479,759 B1 | * | 11/2002 | Ferling et al. | 174/260 |
| 6,498,355 B1 | * | 12/2002 | Harrah et al. | 257/99 |

FOREIGN PATENT DOCUMENTS

| | | |
|---|---|---|
| KR | 2002-50584 | 6/2002 |
| KR | 20-331783 | 11/2003 |

* cited by examiner

*Primary Examiner*—Sharon Payne
(74) *Attorney, Agent, or Firm*—Lowe Hauptman & Berner, LLP.

(57) ABSTRACT

The present invention relates to an LED module for automobile headlights. The LED module comprises a water proof structure together with a heat radiating structure in order to prevent the permeation of external moisture while efficiently radiating heat to the outside. The LED module may be combined with a lamp housing and a radiator to constitute an automobile headlight.

21 Claims, 8 Drawing Sheets

(a)

(b)

LIGHT EMITTING DIODE MODULE FOR AUTOMOBILE HEADLIGHTS AND AUTOMOBILE HEADLIGHT HAVING THE SAME

CLAIM OF PRIORITY

This application claims the benefit of Korean Patent Application No. 2004-51001 filed on Jul. 1, 2004, in the Korean Intellectual Property Office, the disclosure of which is incorporated herein by reference.

BACKGROUND OF THE INVENTION

1. Field of the Invention

The present invention relates to a Light Emitting Diode (LED) module for automobile headlights. More particularly, the present invention relates to an LED module for automobile headlights, which comprises a water proof structure together with a heat radiating structure in order to prevent the permeation of external moisture while efficiently radiating heat to the outside, and an automobile headlight having the same.

2. Description of the Related Art

An LED is one type of semiconductors that generate single colors of light when applied with voltage. The color of light generated from the LED is generally determined by chemical ingredients of the LED. The LED is continuously increasing in demand since it has various merits such as long lifetime, low drive voltage, excellent initial drive properties, high vibration resistance and high tolerance with respect to repeated power switching compared to lighting devices which use a filament.

Recently the input power and output brightness of the LED is rising to such an extent that it can be used in an automobile headlight. Since its lighting efficiency is 1.1 to 1.2 times higher than that of a halogen lamp that is generally used in the automobile headlight, the LED can advantageously save power consumption so much when used in the automobile headlight.

In order to apply a module of this LED to the automobile headlight, it is necessary to previously solve the following problems. First, the LED generates more heat than a bulb in the halogen lamp, and therefore a structure for efficiently radiating heat to the outside is required. Furthermore, as a more important aspect, it is necessary to protect the LED from external moisture.

SUMMARY OF THE INVENTION

The present invention has been made to solve the foregoing problems of the prior art and it is therefore an object of the present invention to provide an LED module for automobile headlights, which comprises a water proof structure together with a heat radiating structure in order to prevent the permeation of external moisture while efficiently radiating heat to the outside.

It is another object of the present invention to provide an automobile headlight incorporating an LED module, which comprises a water proof structure together with a heat radiating structure in order to prevent the permeation of external moisture while efficiently radiating heat to the outside.

According to an aspect of the invention for realizing the object, there is provided an LED module for automobile headlights comprising: a lighting unit including an LED chip; a module body supporting the lighting unit at a leading end and extended from the leading end to a rear end for a predetermined length, the leading end being structured to guide light from the lighting unit in an upward direction, the module body being made of a high thermal conductivity material; a connector sealed to the rear end of the module body, the connector having a conductor extended through the module body for supplying external voltage to the lighting unit; and a transparent member coupled with the leading end of the module body to seal and protect the lighting unit and a portion of the conductor exposed from the leading end of the module body the same from external environment.

Preferably, the module body may include: a cup part projected from an outer circumference of the leading end; a base formed in a central portion of the cup part for guiding light from the lighting module in an upward direction; and a through hole extended from the leading end to the rear end.

Preferably, the transparent member may have a lower circumference engaged with an inside wall of the cup part.

Preferably, the connector may include: a socket placed in a rear end of the connector to electrically connect the connector with an external power source; and an insulator sheath wound on the connector within the module body for insulating the insulator from the module body, wherein the connector is sealed by a leading end thereof to the rear end of the module body to prevent the penetration of foreign material via the through hole toward the lighting unit.

Preferably, the transparent member may include: a transparent elastic encapsulant coupled with the leading end of the module body to seal the lighting unit and the portion of the conductor exposed from the leading end of the module body; and a lens placed outside the transparent elastic body and coupled with the leading end of the module body to protect the transparent elastic body.

Preferably, the lighting unit may include: at least one LED chip; a submount placed on the module body for seating the LED chip thereon, the submount having a pattern printed thereon for connection with the conductor of the connector; and a plurality of solder bumps for attaching the LED chip on the submount and electrically connecting the LED chip with the pattern of the submount.

Preferably, the lighting unit may include: at least one LED chip; a submount placed on the module body for seating the LED chip thereon, the submount having a pattern printed thereon for connection with the conductor of the connector; and a plurality of wires for electrically connecting the LED chip with the pattern of the submount.

Preferably, the base is formed separately from the module body.

According to another aspect of the invention for realizing the object, there is provided an automobile headlight comprising: an LED module, which includes a lighting unit including an LED chip, a module body supporting the lighting unit at a leading end and extended from the leading end to a rear end for a predetermined length, the leading end being structured to guide light from the lighting unit in an upward direction, the module body being made of a high thermal conductivity material, a connector sealed to the rear end of the module body, the connector having a conductor extended through the module body for supplying external voltage to the lighting unit and a transparent member coupled with the leading end of the module body to seal and protect the lighting unit and a portion of the conductor exposed from the leading end of the module body the same from external environment, a shade-shaped lamp housing for grasping the leading end of the module body, the lamp housing having a through hole for the passage of the transparent member; and a radiator coupled around the module body to radiate heat, which is transmitted from the lighting unit via the module body, to external environment.

Preferably, the automobile headlight may further comprise an O-ring interposed between the lamp housing and the module body within the through hole of the lamp housing.

DETAILED DESCRIPTION OF THE PREFERRED EMBODIMENT

The above and other objects, features and advantages of the present invention will be more clearly understood from the following detailed description taken in conjunction with the accompanying drawings.

Figure 1:
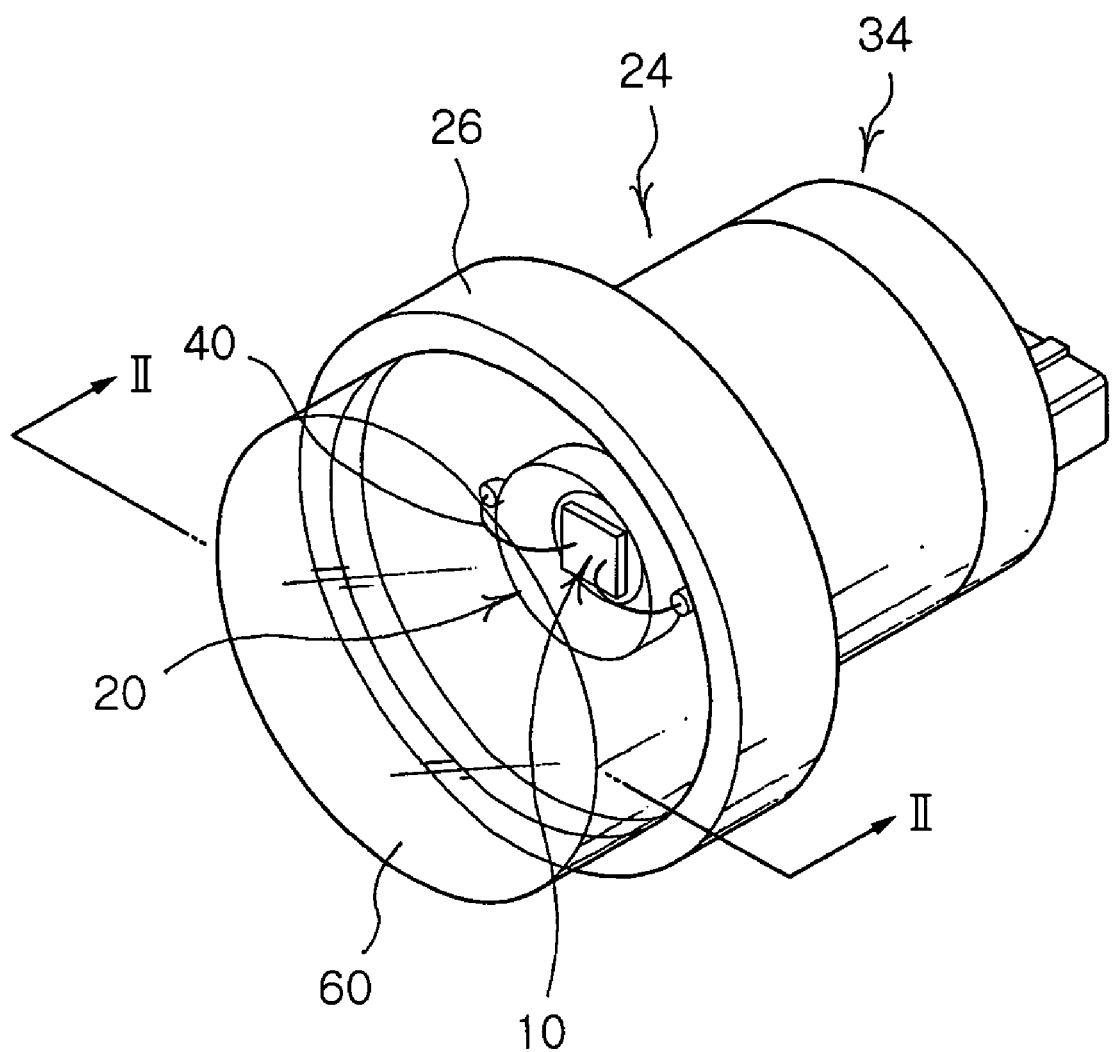
FIG. 1 is a perspective view illustrating an LED module for automobile headlights according to the present invention.
Figure 2:
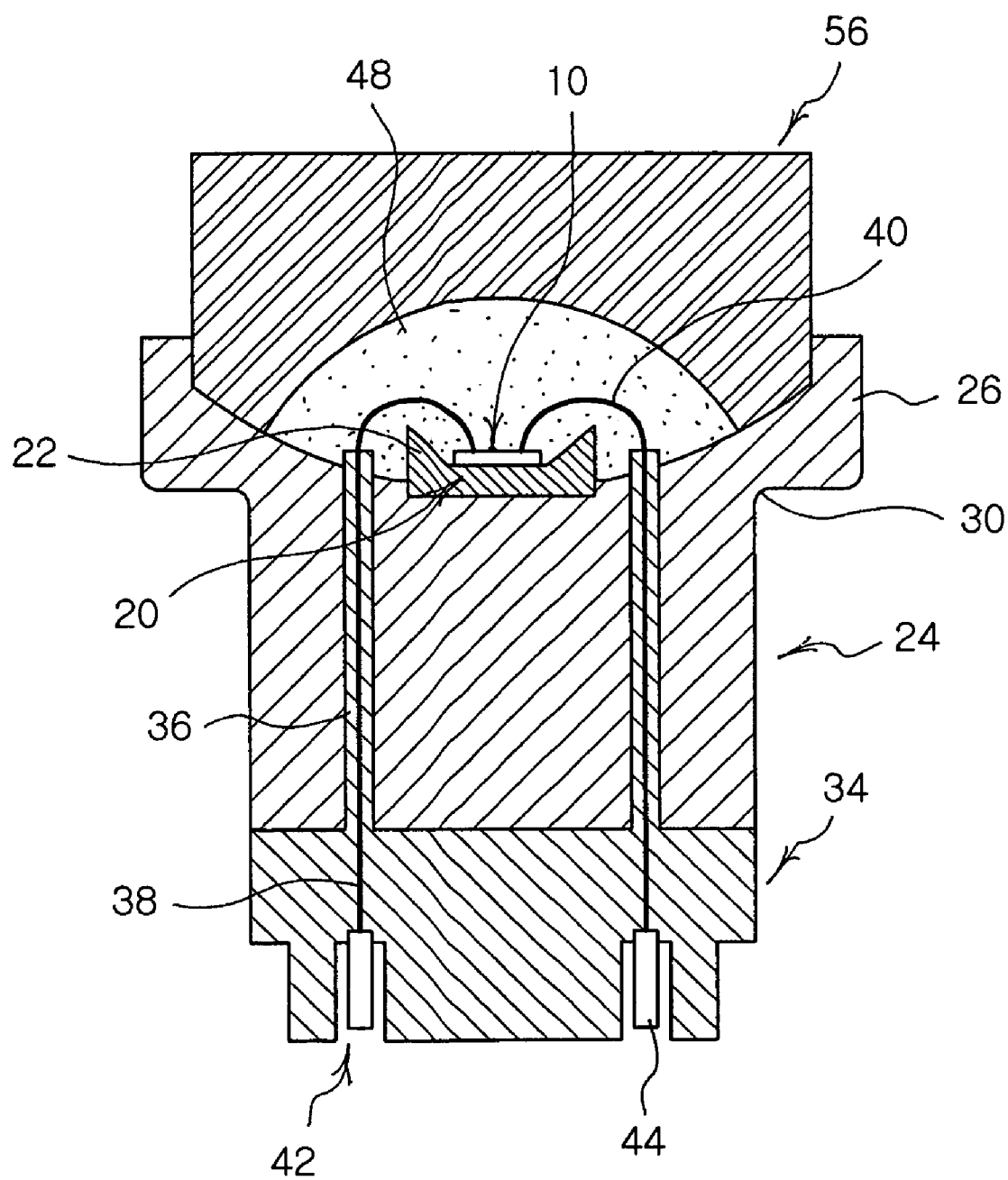
FIG. 2 is a sectional view of the LED module for automobile headlights taken along the line II—II of FIG. 1.
Figure 3:
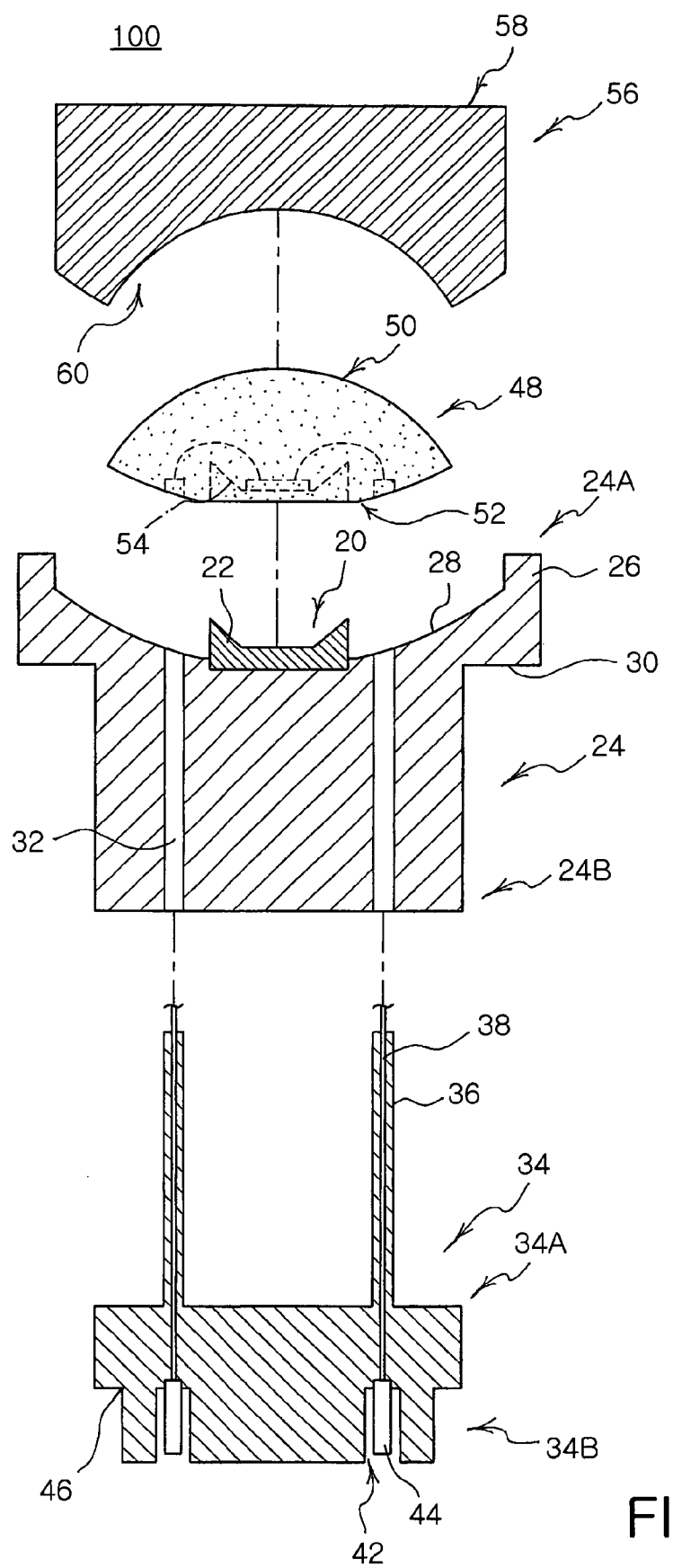
FIG. 3 is an exploded view of FIG. 2.

FIG. 1 is a perspective view illustrating an LED module for automobile headlights according to the present invention, FIG. 2 is a sectional view of the LED module for automobile headlights taken along the line II—II of FIG. 1, and FIG. 3 is an exploded view of FIG. 2.

Referring to FIGS. 1 to 3, an LED module 100 for automobile headlights according to the present invention includes a lighting unit or LED die 10, a die base 20 for supporting the LED die 10 while guiding light from the LED die 10 in an upward direction, a cylindrical LED body 24 having the base 20 coupled with a central portion of a leading end 24A thereof, a connector 34 coupled with a rear end 24B of the LED module body 24 and having a portion electrically connected with the LED die 10 through the module body 24, a transparent elastic encapsulant 48 for sealing the LED die 10, the die base 20 and so on and a lens 56 coupled with the leading end 24A of the module body 24 outside the elastic encapsulant 48 to protect the same.

First, the module body 24 is of a cylindrical member, and made of a metal of excellent thermal conductivity, and preferably, one selected from the group consisting of Al, Ag and Cu or a ceramic composite thereof. The module body 24 of this structure has an excellent thermal conductivity in order to efficiently transmit heat generated from the LED die 10, which is mounted on the leading end 24A of the module body 24, to a radiator 110 (which will be described later with reference to FIGS. 7 and 8).

In case that the module body 24 is made of metal only, it can be formed by for example cutting a metal piece into a desired configuration. In addition, although it has been described that the module body 24 is cylindrically shaped, the module body 24 may preferably have various cross-sections such as polygon and ellipse.

The module body 24 is radially expanded in a rim 30 that is formed at a predetermined position between the leading end 24A and the rear end 24B, and preferably, a vertical point (in the drawing) substantially corresponding to the bottom of the die base 20. When the module body 24 is coupled with the radiator 110 to be described later, the rim 30 functions to prevent the entire module body 24 from being inserted into a through hole 112 of the radiator 110.

The module body 24 has an annular flange 26 formed around the leading end 24A of the module body 24 and a concave recess 28 formed within the flange 26, which imparts a generally cup-shaped structure to the module body 24 together with the annular flange 26. Furthermore, inside the module body 24, there are formed a pair of through holes 32 for receiving sheaths 36, which support conductors 38 of the connector 34 to be described later while insulating the same. Alternatively, the module body 24 has a single through hole formed therein with a cable being inserted through the single hole.

In the meantime, the die base 20 is provided with a reflector 22 for seating the LED die 10 thereon. The reflector 22 is also adapted to guide light from the LED die 10 in an upward direction. The die base 20 is made of a metal such as Al and Ag which has high reflectivity and high thermal conductivity. Alternatively, the die base may be made of a metal such as Cu having high thermal conductivity and excellent workability, and a high reflectivity metal such as Al, Ag and Pd may be plated or coated on the die base.

While it has been described that the die base 20 is made separately from the module body 24 and then coupled with the central portion of the leading end 24A thereof, the die base 20 can be formed integrally with the module body 24 in case that the module body 24 is made of a metal having high workability such as Al, Ag and Cu. Of course, where the module body 24 is made of Cu, a high reflectivity metal such as Al, Ag and Pd is plated or coated on the die base 20 including the reflector 22.

Figure 4:
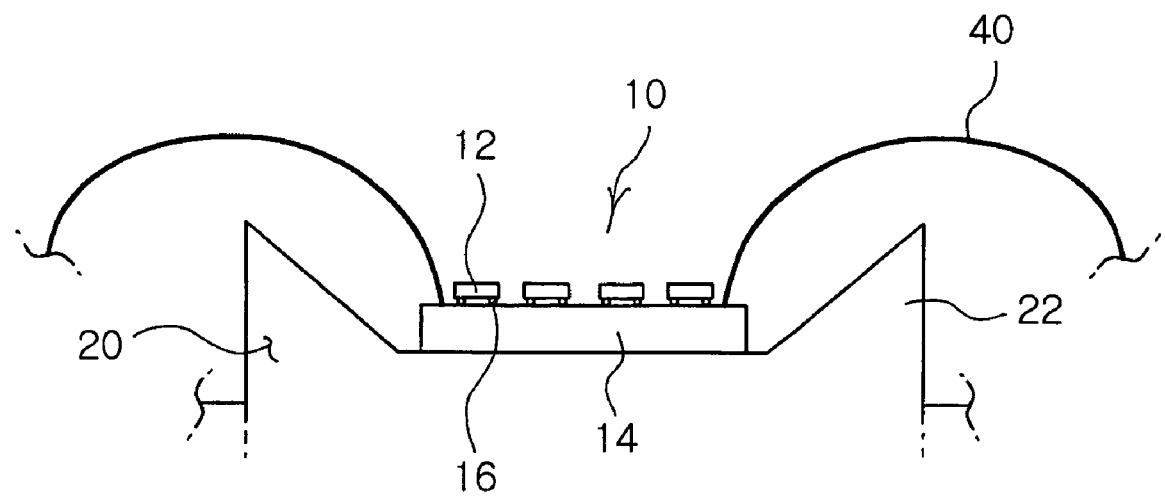
FIG. 4 illustrates examples of an LED die shown in FIG. 2.
Figure 4:
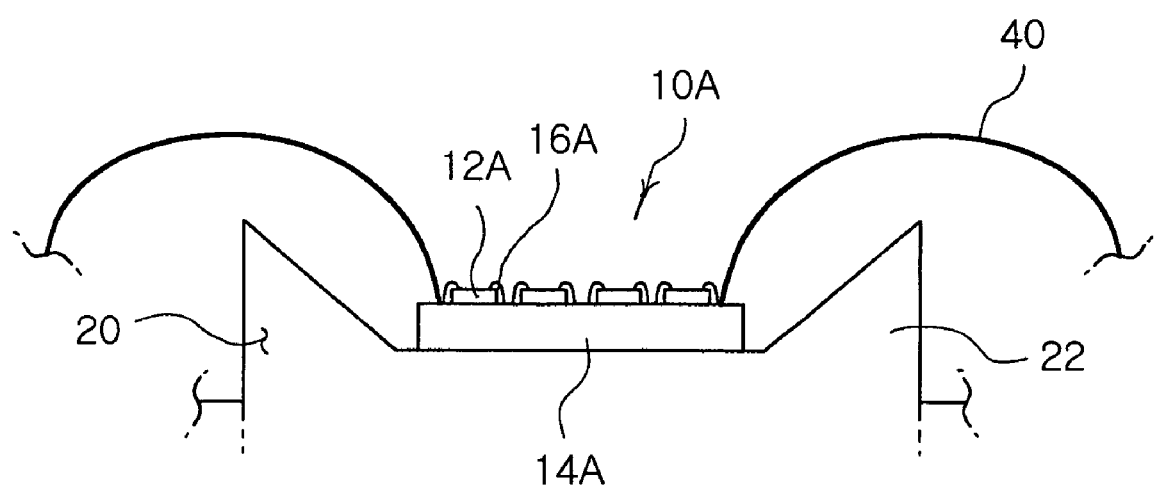

The LED die 10 is mounted on the die base 20, and two examples of the LED die will be described in more detail with reference to FIG. 4.

First, referring to FIG. 4(a), the LED die 10 includes a submount 14 mounted on the die base 20 and printed with a pattern (not shown), a plurality of LED chips 12 seated on the submount 14 in the form of flip chips and a plurality of solder bumps 16 for fixing the LED chips 12 to the submount 14 while electrically connecting the LED chips 12 to the pattern of the submount 14. The solder bumps 16 are made of a metal paste of excellent electric conductivity, and preferably, Au paste in order to have electric conductivity.

The pattern of the submount 14 is electrically connected with wires 40 extended from the conductors 38 so that external voltage supplied to the conductors 38 and the wires 40 of the connector 34 can be transmitted via the pattern of the submount 14 to the LED chips 12 seated on the submount 14.

The advantage of the submount 14 is that the LED chips 12 can be seated on the submount 14 before mounting the submount 14 on the die base 20 so that the LED chips 12 of a small size can be arranged precisely.

Further, the submount 14 is made of silicone, and preferably has a high thermal conductivity in order to effectively transmit heat from the chips 12 to the die base 20 underlying the submount 14. The thermal conductivity necessary for the submount 14 is preferably at least 100 W/m·K, and more preferably at least 200 W/m·K. In the art, the die base 20 and the module body 24 functioning as heat sinks are required to have preferably at least about 200 W/m·K. For reference, Al has a thermal conductivity of about 237 W/m·K, Ag of about 429 W/m·K, Au of about 304 W/m·K and Cu of about 401 W/m·K.

In addition, the submount 14 is made of for example silicone having a predetermined value of elasticity in order to protect the LED chips 12 from external impact, which may damage the LED chips 12 if directly delivered to the chips 12 via the module body 24 and/or the die base 20, thereby improving the reliability of a final product or the LED module 100.

However, the submount 14 is optional, and therefore may be omitted by seating the LED chips 12 directly on the die base 20, mounting the die base 20 on a central portion of the leading end 24A of the module body 24, and then electrically connecting the LED chips 12 with the wires 40.

The die base 20 may be omitted also, in which a cup structure is formed in a central portion of the leading end 24A of the module body 24 and the LED chips 12 are directly mounted on the cup structure.

Since this can reduce required process steps, it can improve productivity and therefore is advantageous in view of mass production.

Moreover, about 10 to 17 LED chips of about 3 to 5 W are necessarily used at present to produce an output power of about 45 to 50 W in order to achieve a desired brightness for automobile headlights. However, not only the submount 14 but also the die base 20 may be omitted since a few number of LED chips or even a single chip is expected to produce the above output power in the near future owing to the development of technology.

Next a modified LED die 10A will be described with reference to FIG. 4(*b*). The LED die 10A includes a submount 14A mounted on the die base 20 and having a pattern (not shown) printed thereon, a plurality of LED chips 12A fixedly seated on the submount 14A and wires 16A for electrically connecting the LED chips 12A with the pattern of the submount 14A. The wires 16A are made of a metal having excellent electric conductivity since they are required to connect the LED chips 14A together with only a low electric conductivity. In particular, the wires 16 are preferably made of Au, which is especially excellent in workability and electric conductivity, since they are to be formed as fine as possible in order to minimize the shielding of light from the LED chips 12A.

The pattern of the submount 14A is electrically connected with the wires 40 extended from the conductors 38 of the connector 34 so that external voltage supplied to the conductors 38 and the wires 40 of the connector 34 is transmitted to the LED chips 12A seated on the submount 14A via the pattern of the submount 14 and the wires 16A.

Other features of the modified LED die 10A are substantially the same as those of the above-described LED die 10, and therefore will not be described in detail.

Although it has been described that the LED die 10, 10A is mounted with the LED chips 12, 12A in a large number, a small number of chips or even a single chip can be adopted on condition that they or it can produce sufficient power.

Further, the LED chips 12, 12A may include a number of RGB chips, in which three RGB chips emitting monochromatic light of different RGB colors are combined into one set, in order to radiate white light. Alternatively, white light can be produced from single-type LED chips for generating the same monochromatic light by coating fluorescent material on the chips or containing fluorescent material in the elastic encapsulant 48.

The connector 34 is of a member made of insulating resin such as plastic, and formed preferably via injection molding. The sheaths 36 are inserted into the through holes 32 of the module body 24, respectively, and the connector 34 is coupled with the module body 24 via suitable coupling means such as adhesion so that the leading end 34A of the connector 34 forms a sealing with the rear end 24B of the module body 24B.

The leading end 34A of the connector 34 is sealingly coupled with the rear end 24A of the module body 24 via suitable coupling means such as adhesion to prevent external moisture from permeating into the LED die 10 through gaps between the sheaths 36 and the through holes 32. In addition, the sheaths 36 may be formed in a diameter slightly larger than that of the through holes 32 to be press fit into the through holes 32. This may prevent the permeation of external moisture while enhancing the coupling force between the module body 24 and the connector 34.

A pair of electrical connection units or sockets 42 are provided in a rear end 34B of the connector 34, and each of the sockets 42 is provided with a jack or pin 44 for electrical connection. The sockets 42 electrically connect the LED die 10 with external voltage via the conductors 36 and the wires 38.

In this case, since the conductors 36 are completely sealed by plastic or resin of the connector 34 and wrapped in the sheaths 36 before extending out of the through holes 32, external moisture and the like cannot permeate along the conductors 36 toward the LED die 10.

The conductors 36 and the wires 40 are made of a metal excellent in electric conductivity and workability such as Au, Ag and Cu. The wires 40 are preferably made of Au, which is especially excellent in workability and electric conductivity, since they are to be formed as fine as possible in order to minimize the shielding of light emitted from the LED die 10. The conductors 36 and the wires 40 may be formed integrally, or separately to be coupled with each other adjacent to the tops of the sheaths 36.

In the meantime, the transparent elastic encapsulant 48 is adapted to seal the LED die 10, the die base 20, the wires 40, exposed upper portions of the conductors 36 and a portion of the concave recess 28 of the module body 24 surrounding the former from the outside.

The elastic encapsulant 48 is made of gel-like elastic resin such as silicone. The silicone-based resin material has excellent optical properties since it has high refractivity and is resistive to yellowing, that is, change in quality induced by single wavelength light. Unlike epoxy which is to be solidified, the silicone-based rein material still remains in a gel or elastomer state even after being cured, and thus can more stably protect the LED die 10, 10A, the wires 40 and the chips 12, 12A against thermal stress, vibration and external impact.

The elastic encapsulant 48 has a convex upper face 50 of a predetermined curvature and a convex lower face 52 corresponding to the concave recess 28 of the module body 24. The elastic encapsulant 48 is adapted to house the LED die 10, the wires 40 and the die base 20 therein in a sealing fashion as represented with dotted lines 54 in FIG. 3.

The configuration of the elastic encapsulant 48 shown in FIG. 3 indicates that in a final product of the LED module 100. The elastic encapsulant 48 maintains a certain degree of fluidity, while it is being processed rather than in the final state.

The elastic encapsulant 48 preferably contains UV absorbent, which serves to prevent the radiation of UV rays from the LED die 10 to the outside, and/or fluorescent material for adjusting the color of light. The fluorescent material for converting monochromatic light into white light may preferably adopt Tb-Al-Garnet (TAG), Yt-Al-Garnet (YAG) and so on. The UV absorbent may adopt suitable fluorescent material that absorbs and converts UV rays into white light.

The elastic encapsulant 48 is covered with the lens 56 made of transparent plastic or epoxy. The lens 56 is preferably sized so that its bottom periphery fits into the inside wall of the flange 26. The bottom 60 of the lens 56 is provided with a concave face therein having a curvature matching that of the convex upper face 50 of the elastic encapsulant 48. The bottom 60 is also provided with a convex face around the concave face thereof, and the convex face of the bottom 60 matches an engaging portion of the concave recess 28 of the module body 24. While the top 58 of the lens 56 is illustrated angled from the side wall of the lens 56, it may alternatively have various configurations such as a dome.

The lens 56 can be coupled with the leading end 24A of the module body 24 via transfer molding of for example epoxy resin. Alternatively, the lens 56 may be molded previously, and then attached to the leading end 24A of the module body 24 via for example adhesive.

In the meantime, the elastic encapsulant 48 and the lens 56 may be replaced by an integral transparent encapsulant. The transparent encapsulant is formed via transfer molding of for example epoxy resin to function as a lens while sealing and protecting the LED die 10, the wires 40, the die base 20 and so on from the external environment. The transparent encalsulant preferably has chemical and physical properties at least capable of blocking chemical or physical influence from the outside. In addition, the transparent encapsulant preferably contains UV absorbent, which serves to prevent the radiation of UV rays from the LED die 10, 10A to the outside, and/or fluorescent material for adjusting the color of light. The fluorescent material for converting monochromatic light into white light may preferably adopt TAG, YAG and so on. The UV absorbent may adopt suitable fluorescent material that absorbs and converts UV rays into white light.

Figure 5:
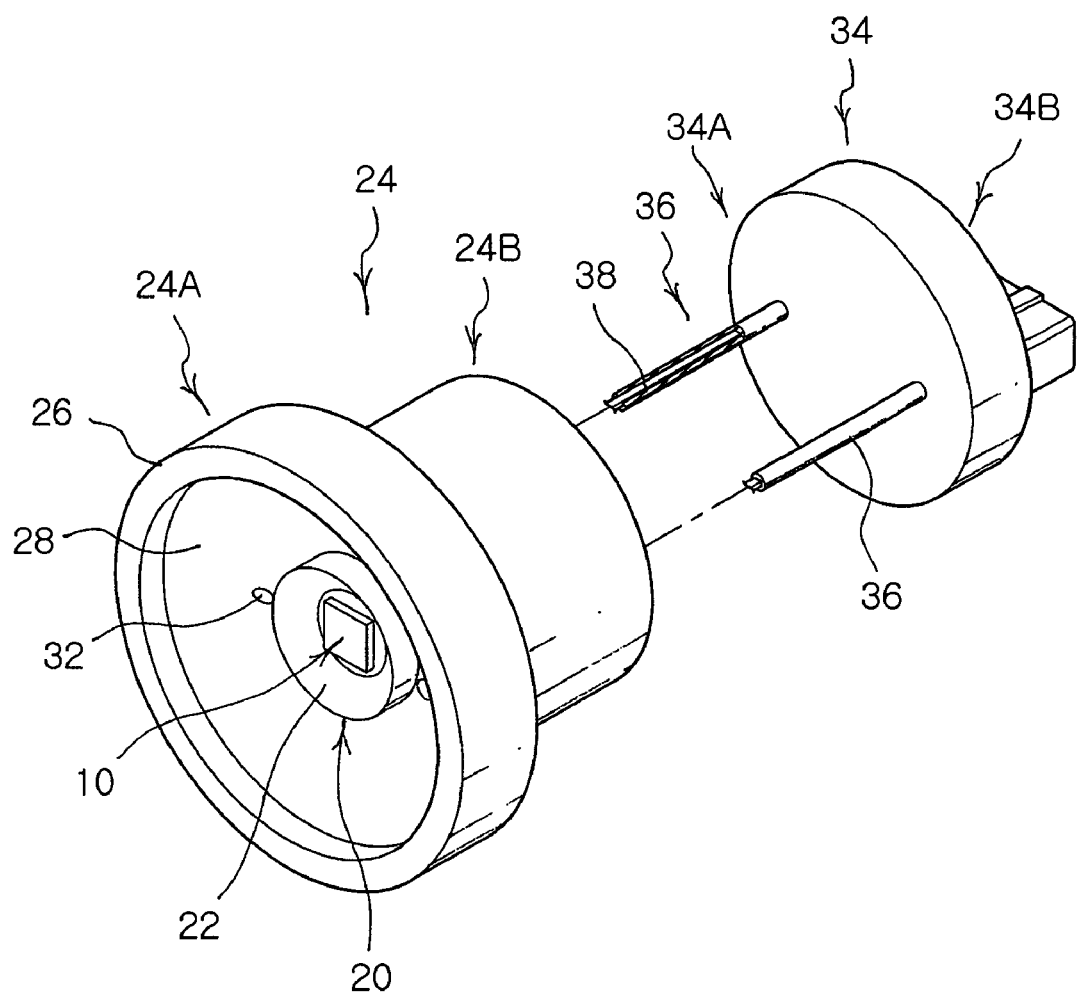
FIG. 5 is a perspective view illustrating the coupling between a body and a connector in an LED module for automobile headlights according to the present invention.
Figure 6:
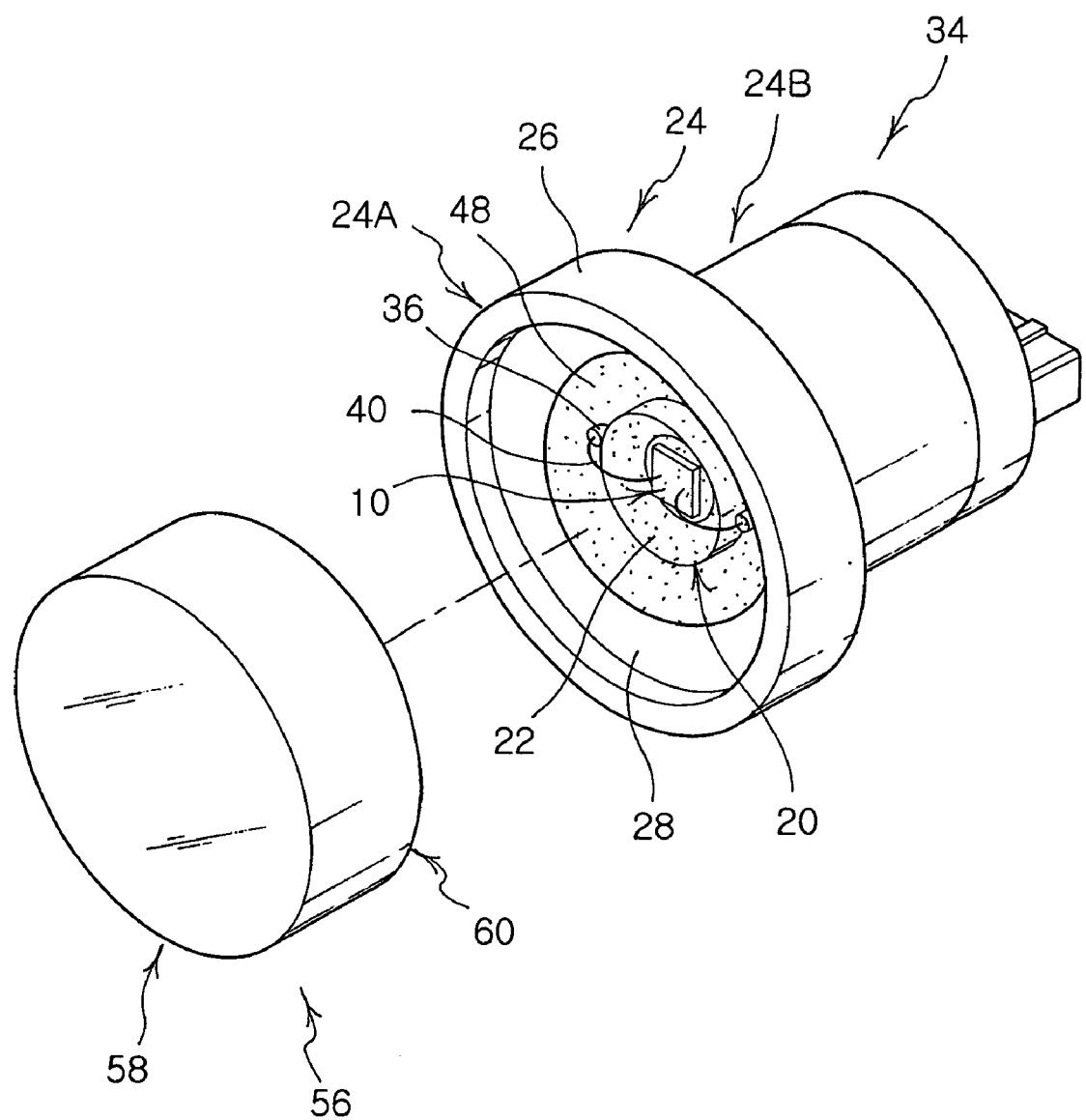
FIG. 6 is a perspective view illustrating the coupling between a body and a lens in an LED module for automobile headlights according to the present invention.

Hereinafter a fabrication process of the LED module 100 will be described with reference to FIGS. 5 and 6, in which FIG. 5 is a perspective view illustrating the coupling between a body and a connector in an LED module for automobile headlights according to the present invention, and FIG. 6 is a perspective view illustrating the coupling between a body and a lens in an LED module for automobile headlights according to the present invention.

As shown in FIG. 5, a die base 20 is mounted on a module body 24, and an LED die 10 is mounted on the die base 20. Then, a connector 34 is coupled with the module body 24 by inserting sheaths 36 into through holes 32 of the module body 24 and engaging a leading end 34A of the connector 34 with a rear end 24B of the module body 24. In this case, one of the connectors 34 is partially broken and wires 40 in the foregoing drawings are not shown for the sake of clarity.

When the connector 34 is coupled with the module body 24 like this, the wires 40 are electrically connected with the LED die 10. In success, elastic resin such as silicone is dispensed onto the die base 20, the LED die 10, the wires 40 and a portion of a concave recess 28 of the module body 24 to form an elastic encapsulant 48 for sealing the same. After the elastic encapsulant 48 is cured to a predetermined degree, a lens 56 is coupled with the concave recess 28 of the module body leading end 24A via transfer molding. Of course, alternatively, a lens 56 containing a fluid elastic encapsulant 48 may be coupled with the concave recess 28 of the module body leading end 24A via a suitable technique such as adhesion. In this case, the lens 56 is turned over, and silicone resin is contained in the lens 56, and then the module body 24 is coupled with the lens 56 from above.

Figure 7:
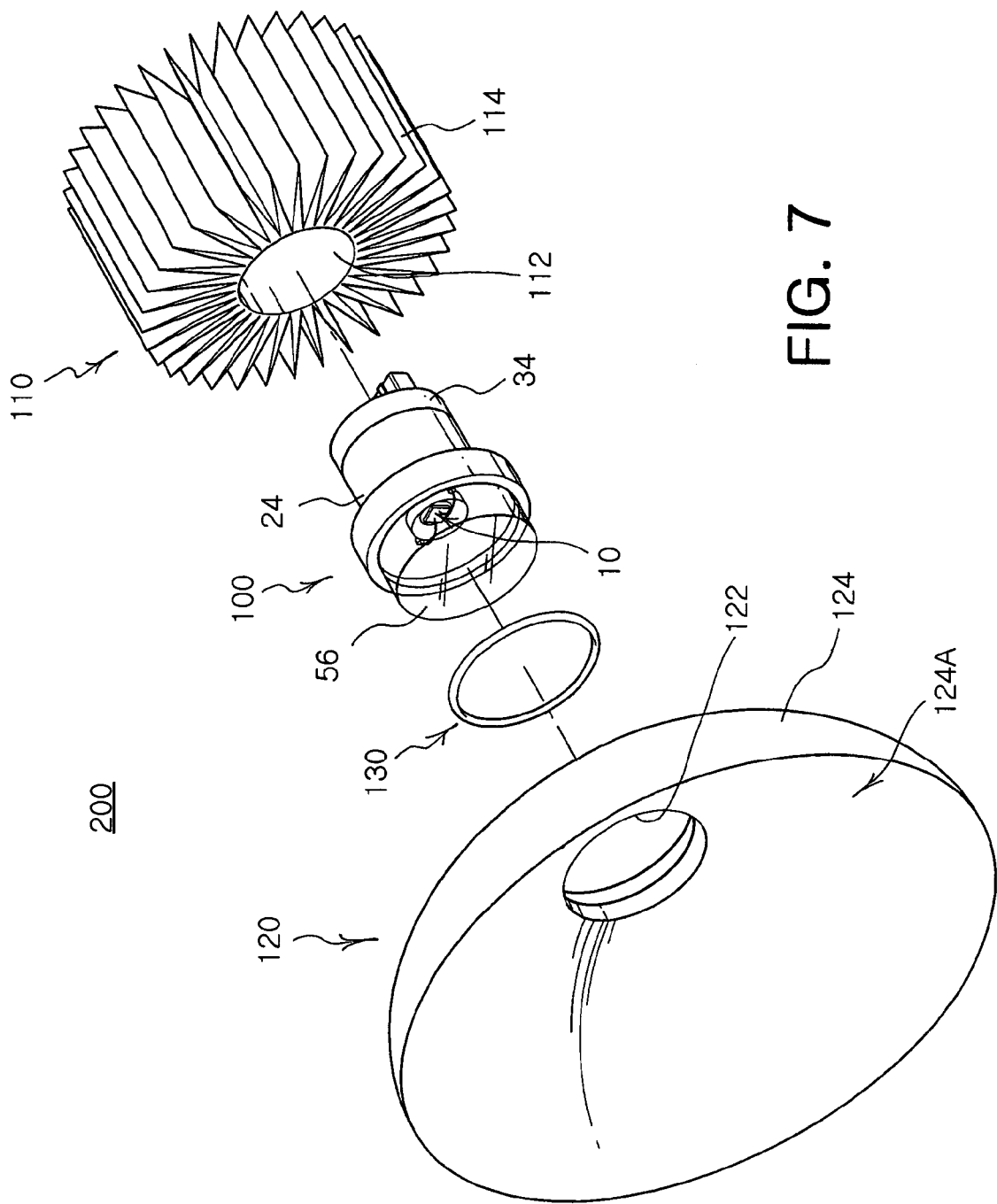
FIG. 7 is an exploded perspective view illustrating an automobile headlight having an LED module for automobile headlights according to the present invention.
Figure 8:
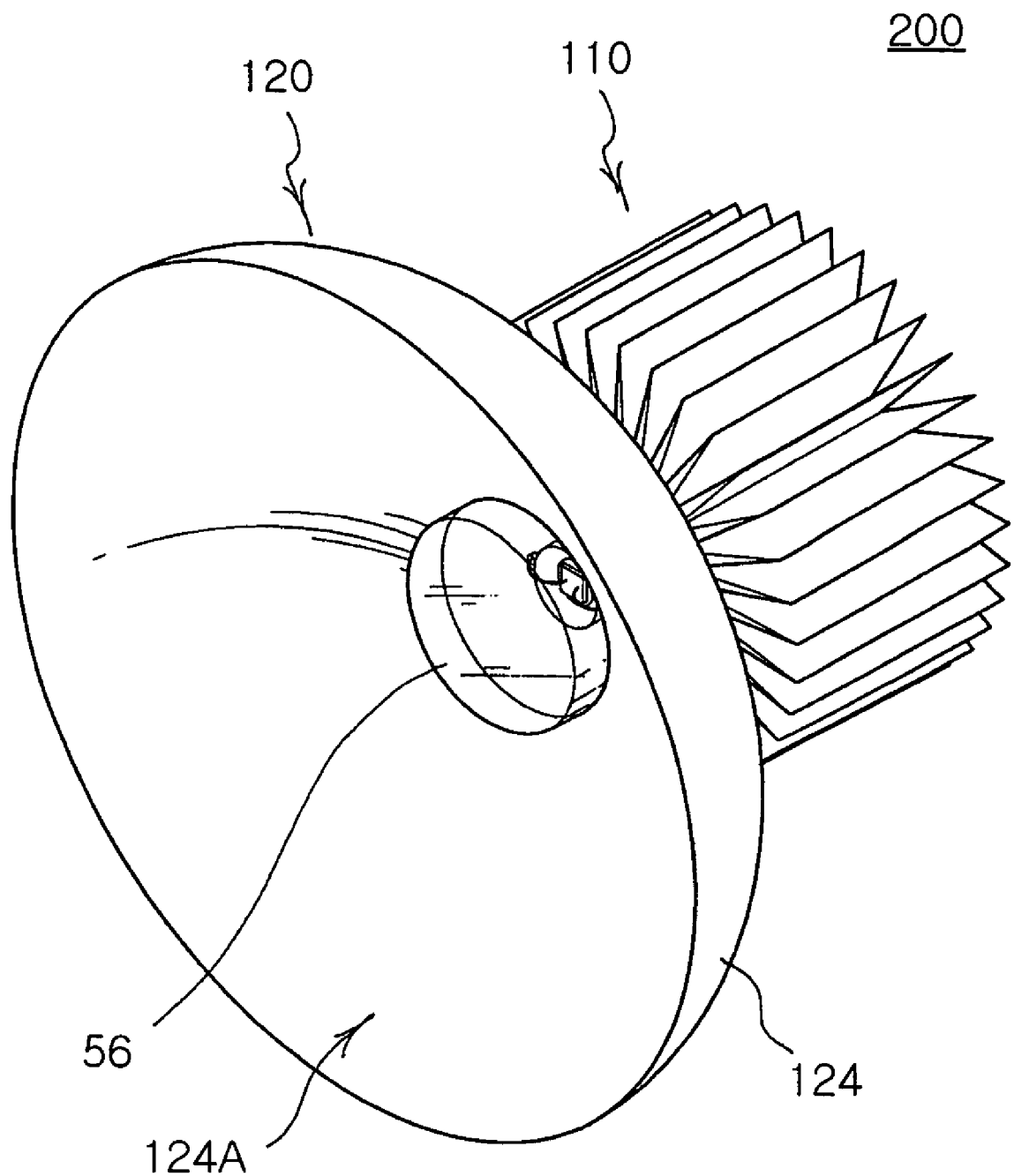
FIG. 8 is a perspective view illustrating an assembled structure of the automobile headlight shown in FIG. 7.

Hereinafter an automobile headlight incorporating the above-described LED module will be described with reference to FIGS. 7 and 8, FIG. 7 is an exploded perspective view illustrating an automobile headlight having an LED module for automobile headlights according to the present invention, and FIG. 8 is a perspective view illustrating an assembled structure of the automobile headlight shown in FIG. 7.

As shown in FIGS. 7 and 8, the automobile headlight 200 of the present invention includes an LED module 100, a lamp housing 124 for grasping a front portion of the LED module 100 including a lens 56 and a leading end of a module body 24 and functioning to guide light from the LED module 100 in a forward direction and a radiator 110 coupled with a rear periphery of the module body 24 to radiate heat from the module body 24 to the outside.

The radiator 110 is made of a material having an excellent thermal conductivity, and has a through hole 112 for receiving a rear part of the module body 24, which is extended from the rim 30 (as shown in FIGS. 2 and 3) to the rear end 24B, and a number of heat radiation fins 114 extended radially around the through hole 112. The rear part of the module body 24 is inserted into the through hole 112 and coupled therewith. The module body 24 can be fixed to the radiator 110 via interference fit or with an additional fixing means. For example, the module body 24 can be screwed into the radiator 110 by forming a male thread in the rear part of the module body 24 and a female thread in the inside wall of the through hole 112 meshing with the male thread of the module body 24. Alternatively, projections or grooves may be provided in the rear end of the module body 24 or the connector 34 and hooks may be provided in a rear end of the heat radiator 110 corresponding to the former so that the projections or grooves are coupled with the hooks, respectively.

The lamp housing 124 is provided with a shade 124 for guiding light from the LED module 100 in a forward direction, and a through hole 122 for receiving a front part of the LED module 100.

The through hole 122 of the lamp housing 124 is provided with a step for preventing the LED module 100 from projecting beyond a front face 124A of the lamp housing 124 to a predetermined degree when the front part of the lens 56 and the module body 24 are received in the through hole 122. The step of the through hole 122 allows the lens 56 to project from the front face 124A of the lamp housing 124 while maintaining the flange in the front end 24A of the module body 24 (as specifically shown in FIGS. 2 and 3) within the through hole 122.

The lamp housing 124 may be made of various materials, and preferably a high reflectivity material. In particular, at least the front face 124 is necessarily coated or plated with a high reflectivity material.

In addition, an O-ring 130 may be interposed between the lamp housing 124 and the LED module 100 in order to improve the sealing while enhancing the coupling therebetween. The O-ring 130 is caught by the step of the through hole 122 and thereby coupled between the lamp housing 124 and the LED module 100.

As not shown in the drawings, locking means may be preferably provided in a rear end of the lamp housing 124 and a front end of the heat radiator 110 to detachably lock the lamp housing 124 with the heat radiator 110. The locking means can adopt various structures well-known in the art, and therefore will not be described in detail.

As described hereinbefore, the present invention can supply external voltage to the LED chip or chips of the LED module via the connector in order to prevent the permeation of for example external moisture to the chips of chips inside the LED module.

Moreover, the module body supporting the LED die is made of a high thermal conductivity material and the radiator is coupled around the module body in order to efficiently radiate heat from the LED die to the outside.

While the present invention has been shown and described in connection with the preferred embodiments, it will be apparent to those skilled in the art that modifications and variations can be made without departing from the spirit and scope of the invention as defined by the appended claims.

What is claimed is:

1. A Light Emitting Diode (LED) module comprising:
    a lighting unit including an LED chip;
    a module body supporting the lighting unit at a leading end and extending from the leading end to a rear end for a predetermined length, the leading end being structured to guide light from the lighting unit in an upward direction, the module body being made of a high thermal conductivity material and having a through hole extending through the length of the modular body;
    a connector sealingly coupled to the rear end of the module body, the connector having a conductor inserted into and extending through the through hole in the module body for supplying external voltage to the lighting unit; and
    a transparent member coupled with the leading end of the module body to seal and protect the lighting unit and a portion of the conductor exposed from the leading end of the module body from an external environment.

2. The LED module according to claim 1, wherein the module body includes:
    cup part projected from an outer circumference of the leading end;
    a base formed in a central portion of the cup part for guiding light from the lighting module in an upward direction; and
    a through hole extending from the leading end to the rear end.

3. The LED module according to claim 2, wherein the transparent member has a lower circumference engaged with an inside wall of the cup part.

4. The LED module according to claim 1, wherein the connector includes:
    a socket placed in a rear end of the connector to electrically connect the connector with an external power source; and
    an insulator sheath disposed on the connector within the module body for insulating the conductor from the module body,
    wherein the connector is sealed by a leading end thereof to the rear end of the module body to prevent the penetration of foreign material via the through hole toward the lighting unit.

5. The LED module according to claim 1, wherein the transparent member includes:
    a transparent elastic encapsulant coupled with the leading end of the module body to seal the lighting unit and the portion of the conductor exposed from the leading end of the module body; and
    a lens placed outside the transparent elastic body and coupled with the leading end of the module body to protect the transparent elastic body.

6. The LED module according to claim 1, wherein the lighting unit includes:
    at least one LED chip;
    a submount placed on the module body for seating the LED chip thereon, the submount having a pattern printed thereon for connection with the conductor of the connector; and
    a plurality of solder bumps for attaching the LED chip on the submount and electrically connecting the LED chip with the pattern of the submount.

7. The LED module according to claim 1, wherein the lighting unit includes:
    at least one LED chip;
    a submount placed on the module body for seating the LED chip thereon, the submount having a pattern printed thereon for connection with the conductor of the connector; and
    a plurality of wires for electrically connecting the LED chip with the pattern of the submount.

8. The LED module according to claim 2, wherein the base is formed separately from the module body.

9. The LED module according to claim 1, wherein the transparent member comprises a rigid portion and an elastic encapsulant portion.

10. The LED module according to claim 9, wherein the elastic encapsulant portion is arranged between the rigid portion and the lighting unit.

11. The LED module according to claim 9, wherein the elastic encapsulant maintains a degree of fluidity and assumes one of a post cured gel or elastomer state so as to stably protect LED and wires associated with the lighting unit.

12. The LED module according to claim 9, wherein the encapsulant portion contains one of a UV absorbent and a fluorescent material.

13. The LED module according to claim 12, wherein the fluorescent material one of adjusts the color of the light produced by the light unit or converts UV rays into white light.

14. The LED module according to claim 9, wherein the encapsulant portion is configured as a lens.

15. The LED module according to claim 1, wherein the transparent member is configured as a lens.

16. The LED module according to claim 1, further comprising:
    a second through hole which extends through the module body so as to be essentially parallel to the first said through hole; and
    a second connector having a conductor inserted into and extending through the second through hole, the second connector and the first said connector cooperating to supply an external voltage to the lighting unit.

17. The LED module according to claim 16, wherein the second conductor and the first said conductor are each enclosed in an insulative sheath having an essentially straight tubular configuration.

18. An automobile headlight comprising:
    a Light Emitting Diode (LED) module which Includes:
        a lighting unit including an LED chip;
        a module body supporting the lighting unit at a leading end and extending from the leading end to a rear end for a predetermined length, the leading end being structured to guide light from the lighting unit in an upward direction, the module body being made of a high thermal conductivity material and having a through hole extending through a length of the module body;

a connector sealingly coupled to the rear end of the module body, the connector having a conductor inserted into and extending through the through hole in the module body for supplying external voltage to the lighting unit; and a transparent member coupled with the leading end of the module body to seal and protect the lighting unit and a portion of the conductor exposed from the leading end of the module body from external environment;

a shade-shaped lamp housing for grasping the leading end of the module body, the lamp housing having a through hole for the passage of the transparent member; and a radiator coupled around the module body to radiate heat, which is transmitted from the lighting unit via the module body, to external environment.

19. The automobile headlight according to claim 18, further comprising: an 0-ring interposed between the lamp housing and the module body within the through hole of the lamp housing.

20. The automobile headlight according to claim 18, wherein the module body includes:

a cup part projected from an outer circumference of the leading end;

a base formed in a central portion of the cup part for guiding light from the lighting module in an upward direction; and a through hole extending from the leading end to the rear end.

21. The automobile headlight according to claim 18, wherein the connector includes:

a socket placed in a rear end of the connector to electrically connect the connector with an external power source; and an insulator sheath wound on the connector within the module body for insulating the conductor from the module body, wherein the connector is sealed by a leading end thereof to the rear end of the module body to prevent the penetration of foreign material via the through hole toward the lighting unit.

* * * * *